(12) United States Patent
Jeon

(10) Patent No.: US 7,413,451 B2
(45) Date of Patent: Aug. 19, 2008

(54) CONNECTOR HAVING SELF-ADJUSTING SURFACE-MOUNT ATTACHMENT STRUCTURES

(76) Inventor: Myoungsoo Jeon, 39422 Zacate Ave., Fremont, CA (US) 94539

( * ) Notice: Subject to any disclaimer, the term of this patent is extended or adjusted under 35 U.S.C. 154(b) by 0 days.

(21) Appl. No.: 11/594,314

(22) Filed: Nov. 7, 2006

(65) Prior Publication Data

US 2008/0108233 A1 May 8, 2008

(51) Int. Cl.
H01R 12/00 (2006.01)
(52) U.S. Cl. ....................................... 439/83
(58) Field of Classification Search .............. 439/67, 439/63, 83, 79, 74, 607, 608; 228/180, 122; 29/831, 840
See application file for complete search history.

(56) References Cited

U.S. PATENT DOCUMENTS

| | | | | |
|---|---|---|---|---|
| 5,607,326 A | | 3/1997 | McNamara et al. | 439/608 |
| 5,653,617 A | * | 8/1997 | Seidler | 439/876 |
| 5,666,721 A | * | 9/1997 | Sakemi | 29/843 |
| 5,702,258 A | | 12/1997 | Provencher et al. | 439/79 |
| 5,713,126 A | * | 2/1998 | Sakemi | 29/843 |
| 5,860,816 A | | 1/1999 | Provencher et al. | 439/79 |
| 5,980,321 A | | 11/1999 | Cohen et al. | 439/608 |
| 5,993,259 A | | 11/1999 | Stokoe et al. | 439/608 |
| 6,293,827 B1 | | 9/2001 | Stokoe | 439/608 |
| 6,299,483 B1 | | 10/2001 | Cohne et al. | 439/608 |
| 6,379,188 B1 | | 4/2002 | Cohen et al. | 439/608 |
| 6,409,543 B1 | | 6/2002 | Astbury, Jr. et al. | 439/608 |
| 6,503,103 B1 | | 1/2003 | Cohen et al. | 439/608 |
| 6,506,076 B2 | | 1/2003 | Cohen et al. | 439/608 |
| 6,517,360 B1 | | 2/2003 | Cohen | 439/65 |
| 6,554,647 B1 | | 4/2003 | Cohen et al. | 439/607 |
| 6,602,095 B2 | | 8/2003 | Astbury, Jr. et al. | 439/608 |
| 6,607,402 B2 | | 8/2003 | Cohen et al. | 439/608 |
| 6,623,302 B2 | | 9/2003 | Billman et al. | 439/608 |
| 6,641,410 B2 | | 11/2003 | Marvin et al. | 439/83 |
| 6,663,426 B2 | | 12/2003 | Hasircoglu et al. | 439/608 |
| 6,663,442 B1 | | 12/2003 | Helster et al. | 439/751 |
| 6,709,294 B1 | | 3/2004 | Cohen et al. | 439/608 |
| 6,739,918 B2 | | 5/2004 | Cohen et al. | 439/701 |
| 6,764,349 B2 | | 7/2004 | Provencher et al. | 439/701 |
| 6,776,659 B1 | | 8/2004 | Stokoe et al. | 439/608 |

(Continued)

OTHER PUBLICATIONS

"HX2 series—High Speed and High Density Connectors for 10Gbps Backplane System", by Hirose Electronics Co. Ltd, revision 1.0, 10 pages (Sep. 12, 2003).

*Primary Examiner*—Alexander Gilman
(74) *Attorney, Agent, or Firm*—Imperium Patent Works; T. Lester Wallace; Zheng Jin

(57) ABSTRACT

A high speed electrical connector includes a plurality of substantially planar signal transmission bodies (SPSTB), an insulative housing that retains the plurality of SPSTBs, and a plurality of self-adjusting surface-mount attachment structures (SASMAS). Each SASMAS is confined in its own guide with respect to an associated SPSTB. During the connector-to-printed circuit board (PCB) attachment process, the connector is heated so that solder within the connector that holds the SASMAS structures in place melts. As the connector settles with respect to the PCB, the SASMAS structures slide in their respective guides varying amounts to accommodate non-planarity of the upper surface of the PCB. In one example, each SPSTB is a printed circuit that has a plurality of signal conductors. Each conductor terminates in planar sliding surface. A SASMAS is self-adjustably soldered to each such sliding surface.

18 Claims, 11 Drawing Sheets

U.S. PATENT DOCUMENTS

| | | | |
|---|---|---|---|
| 6,780,059 B1 | 8/2004 | Payne et al. | 439/608 |
| 6,786,771 B2 | 9/2004 | Gailus | 439/608 |
| 6,808,399 B2 | 10/2004 | Rothermel et al. | 439/108 |
| 6,808,420 B2 | 10/2004 | Whiteman, Jr. et al. | 439/608 |
| 6,814,619 B1 | 11/2004 | Stokoe et al. | 439/608 |
| 6,817,868 B2 | 11/2004 | Matsuo et al. | 439/65 |
| 6,824,391 B2 | 11/2004 | Mickievicz et al. | 439/61 |
| 6,827,611 B1 | 12/2004 | Payne et al. | 439/608 |
| 6,851,980 B2 | 2/2005 | Nelson et al. | 439/608 |
| 6,866,549 B2 | 3/2005 | Kimura et al. | 439/701 |
| 6,872,085 B1 | 3/2005 | Cohen et al. | 439/108 |
| 6,986,682 B1 * | 1/2006 | Jeon | 439/608 |
| 2001/0005654 A1 | 6/2001 | Cohen et al. | |
| 2002/0098727 A1 | 7/2002 | McNamara et al. | |
| 2002/0111069 A1 | 8/2002 | Astbury, Jr. et al. | |

* cited by examiner

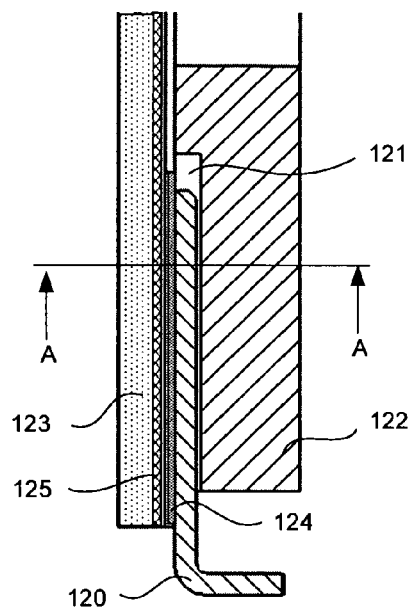
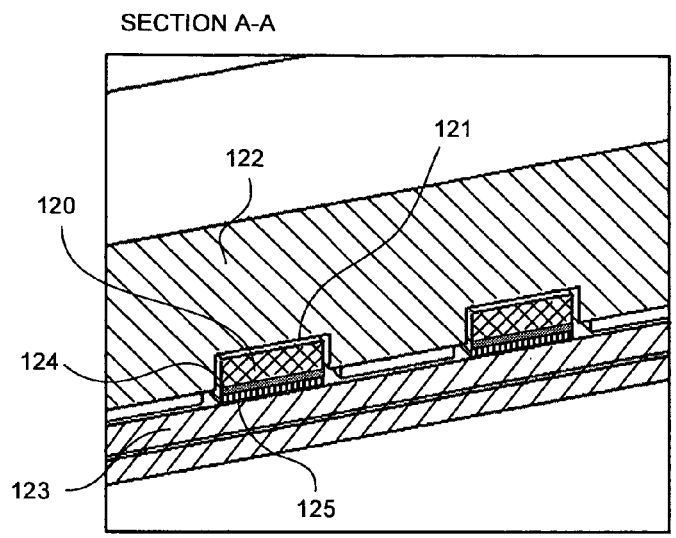
FIG. 14  FIG. 15
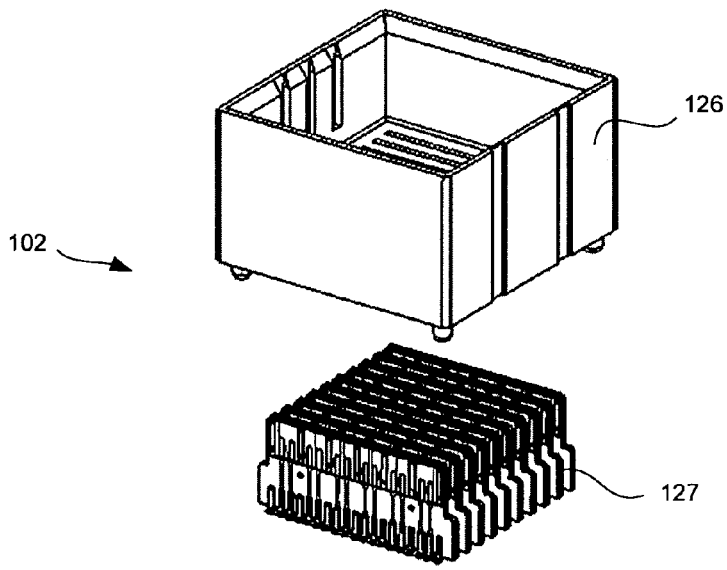
FIG. 16

BEFORE REFLOW SOLDERING
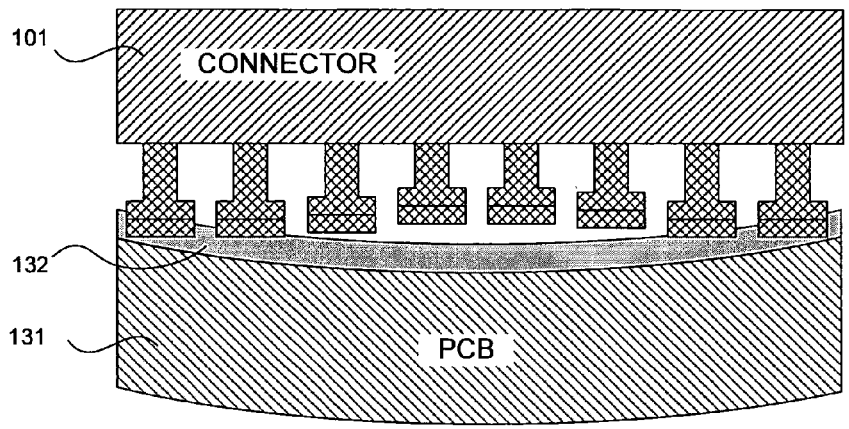
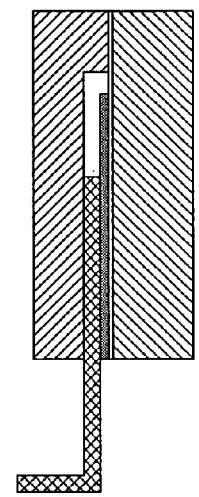
FIG. 19  FIG. 20
AFTER REFLOW SOLDERING
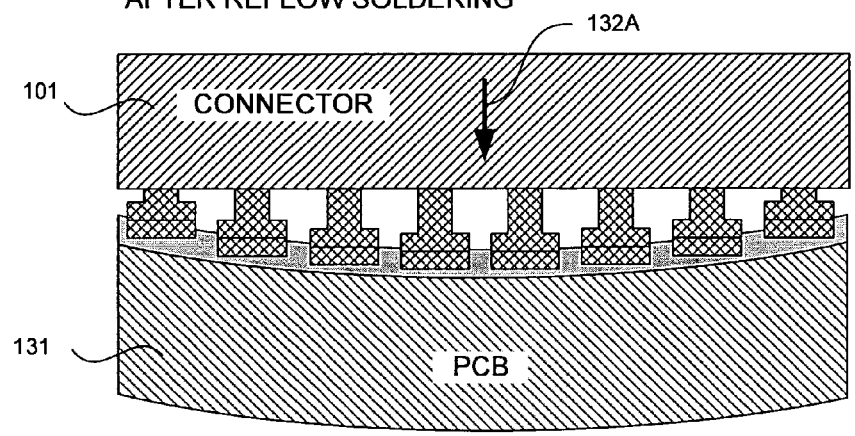
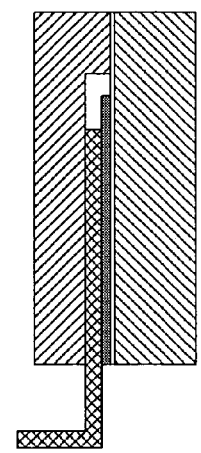
FIG. 21  FIG. 22

CONNECTOR HAVING SELF-ADJUSTING SURFACE-MOUNT ATTACHMENT STRUCTURES

BACKGROUND INFORMATION

Figure 1:
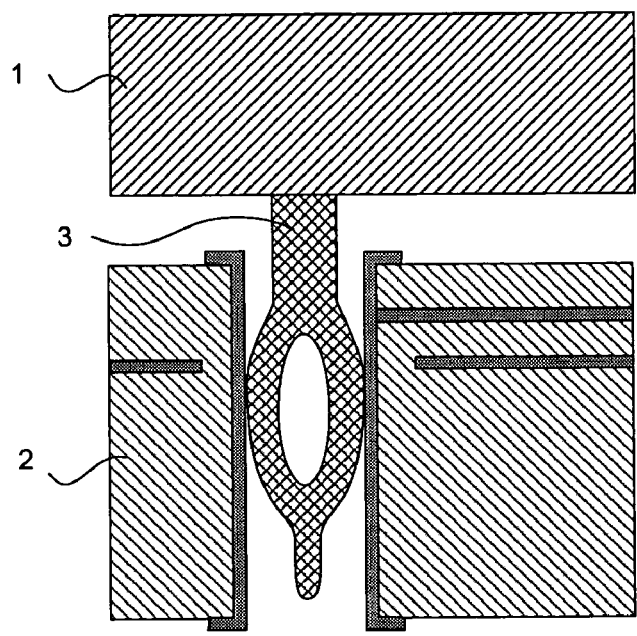

FIG. 1 (Prior Art) is a cross-sectional diagram of a connector 1 that is connected to a printed circuit board 2 by a press fit pin 3.

Figure 2:
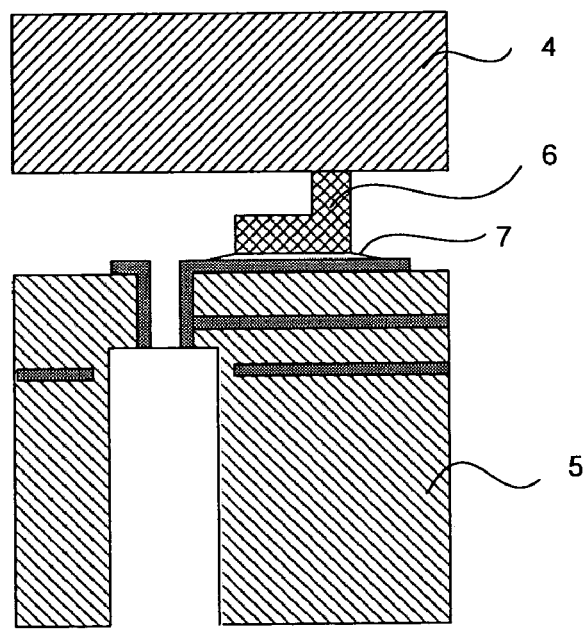

FIG. 2 (Prior Art) is a cross-sectional diagram of a connector 4 that is surface-mount connected to a printed circuit board 5 by a solder tail 6 and solder 7.

Figure 3:
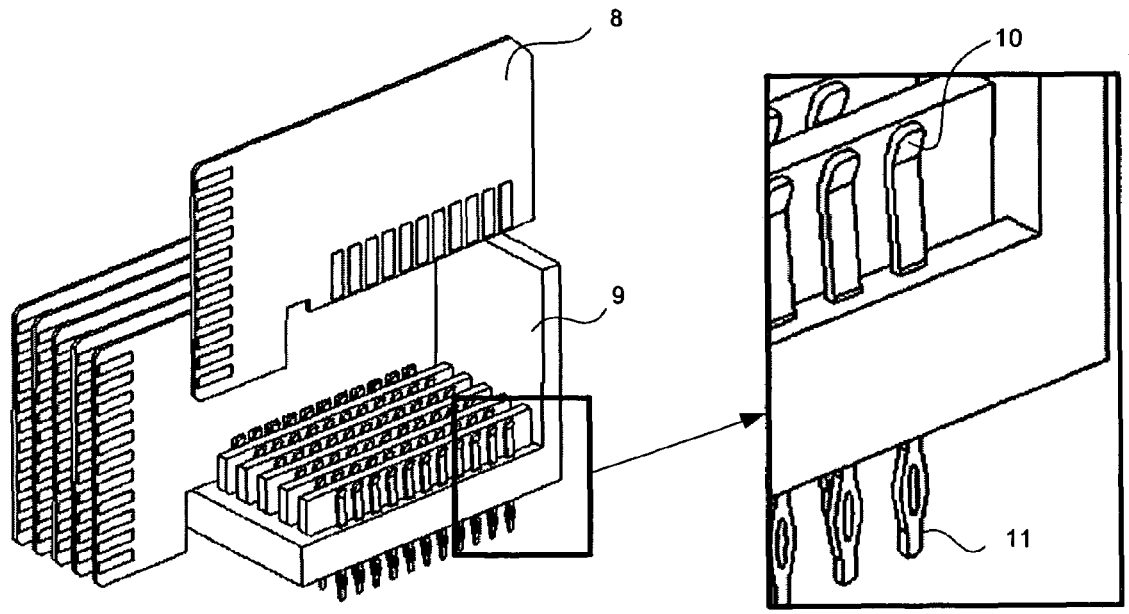

FIG. 3 (Prior Art) is an exploded perspective view of a portion of a backplane connector involving a printed circuit 8 and an insulative housing 9. The printed circuit 8 is inserted to make contact with contact beam 10. Contact beam 10 is stamped out of sheet metal to form a single member that includes contact beam 10 and press fit pin 11.

Figure 4:
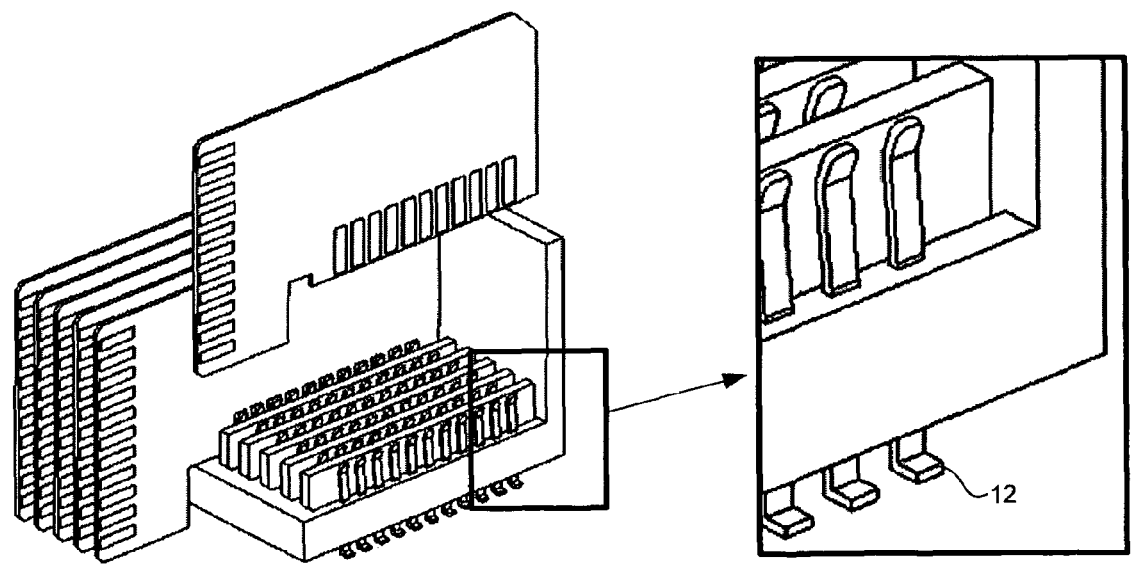

FIG. 4 (Prior Art) is an exploded view of a backplane connector that is similar to the connector of FIG. 3, except that the connector of FIG. 4 has surface mount attachment structures 12 rather than press fit pins 11.

Figure 5:
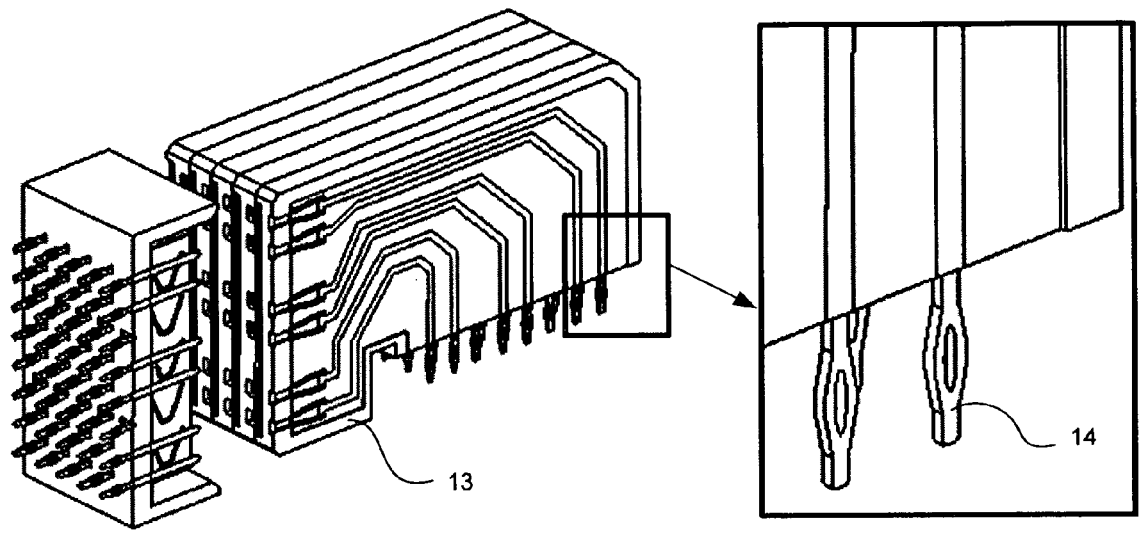

FIG. 5 (Prior Art) is an exploded perspective view of a part of a backplane connector that involves a stack of wafers 13. Each wafer includes a metal signal conductor that is stamped out of a piece of sheet metal. The press fit pins 14 are integrally formed with the metal signal conductors.

Figure 6:
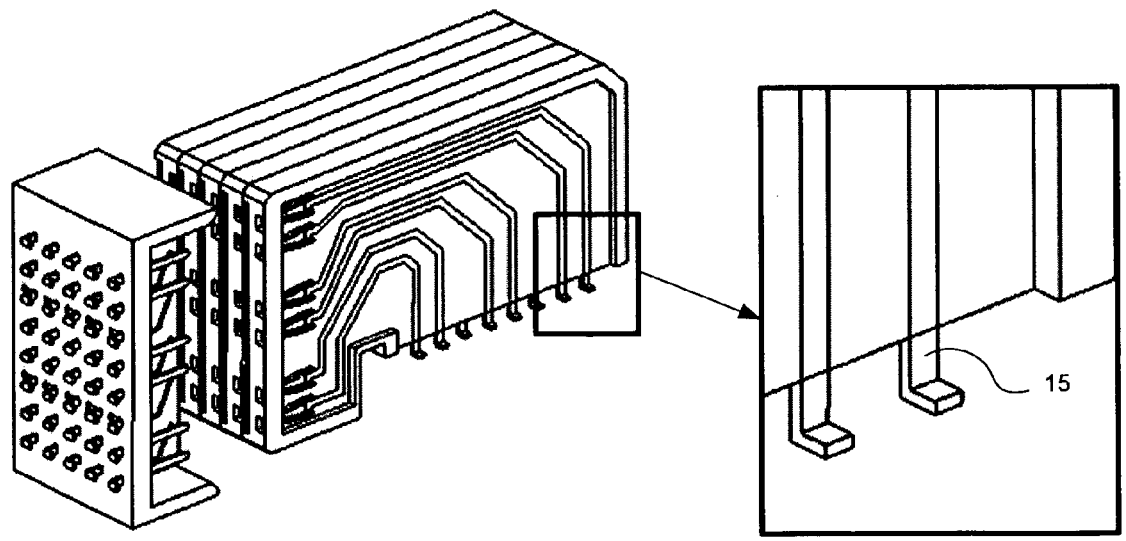

FIG. 6 (Prior Art) is an exploded perspective view of a part of a backplane connector similar to the connector of FIG. 5 except that the connector of FIG. 6 has surface mount attachment terminations 15 of the stamped metal signal conductors.

Figure 7:
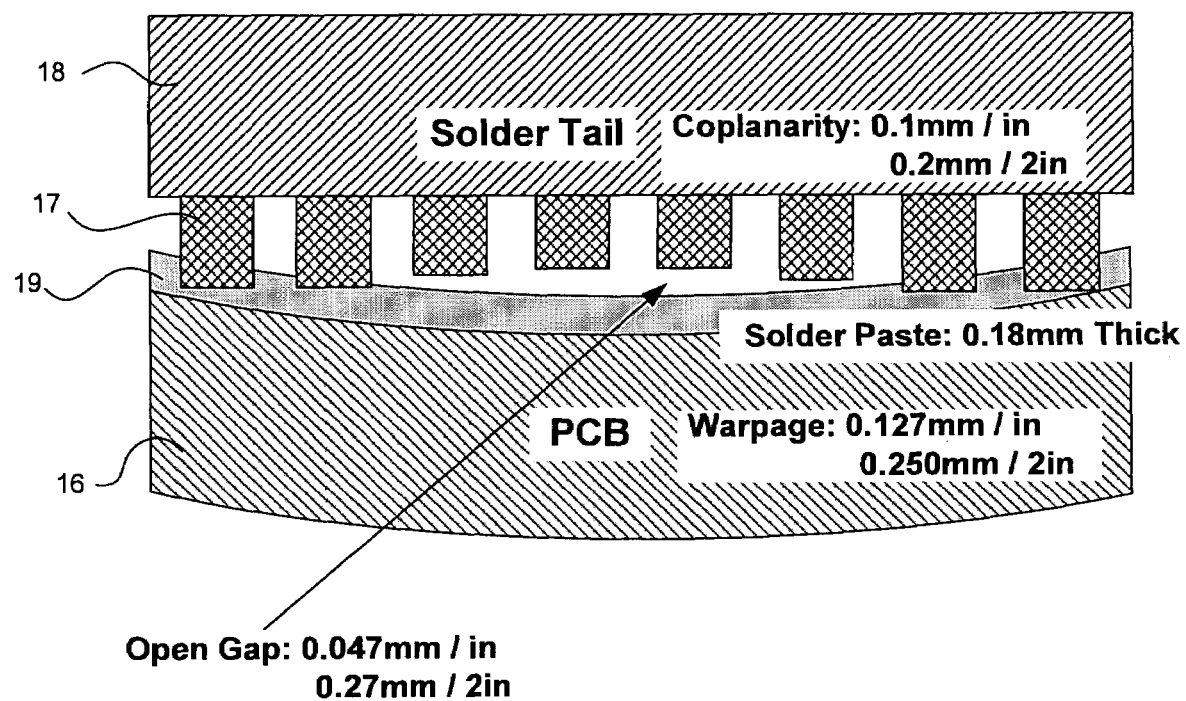

FIG. 7 (Prior Art) is a simplified cross-sectional view that illustrates a problem with current surface-mount connectors and their attachment to printed circuit boards. Due to warpage of the printed circuit board 16, some of the surface mount attachment structures 17 of the connector 18 may not contact and with solder paste 19 and therefore may not be properly soldered to the printed circuit board 16 in the reflow soldering operation.

DETAILED DESCRIPTION

Figure 8:
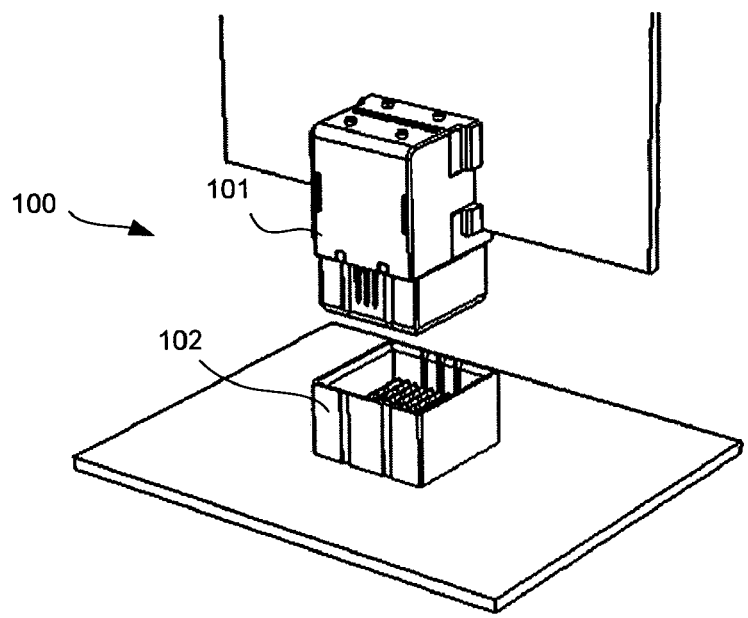

FIG. 8 is a perspective view in accordance with one novel aspect. A connector assembly 100 includes a daughter card connector 101 and a motherboard connector 102. Daughter card connector 101 has a laterally displaceable head portion as described in U.S. Pat. No. 6,986,682 (the subject matter of which is incorporated herein by reference).

Figure 9:
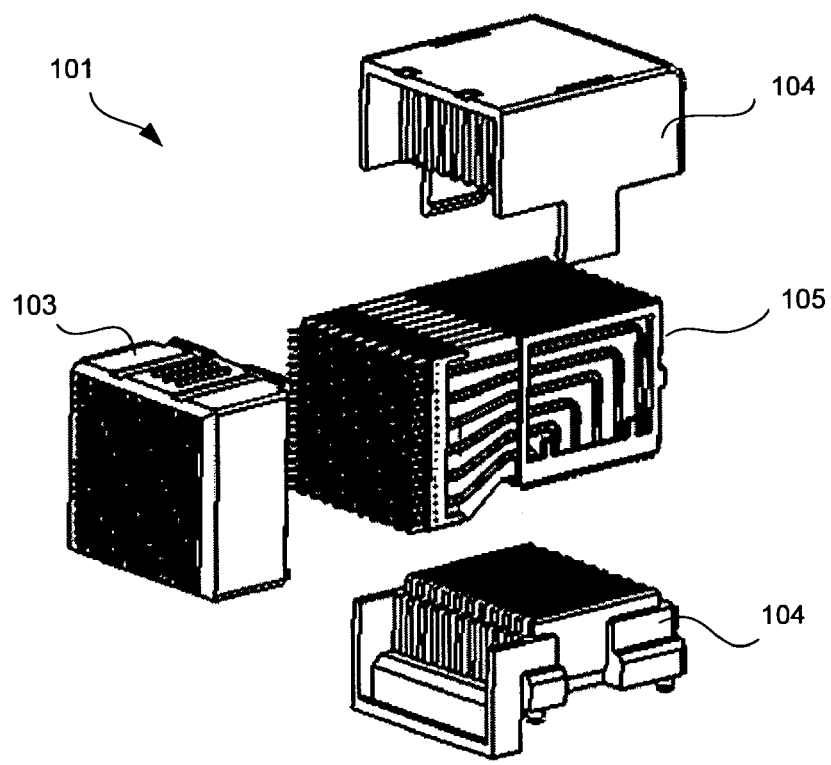

FIG. 9 is an exploded view of connector 101. Connector 101 includes a head housing portion 103 and a body housing portion 104. Contained within the body housing portion 104 is a plurality of substantially planar signal transmission bodies (SPSTBs) 105. The SPSTBs are disposed in parallel with one another to form a stack.

Figure 10:
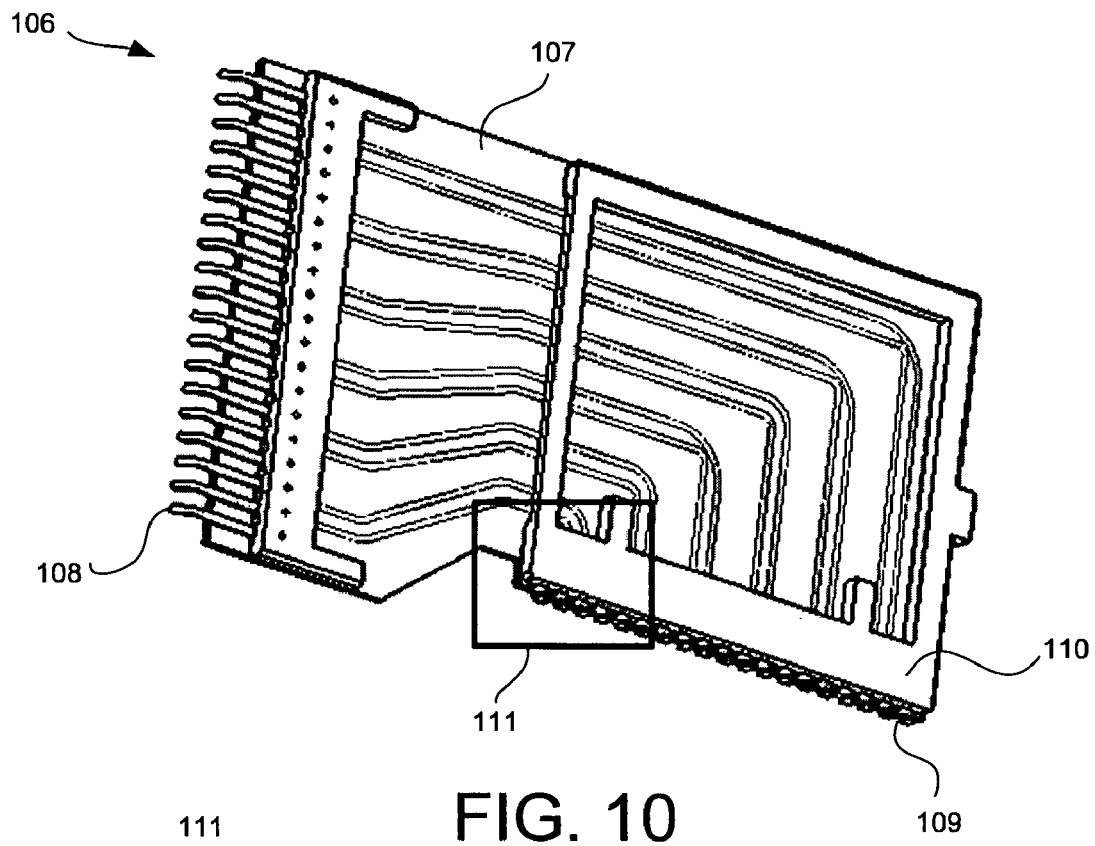

FIG. 10 is an perspective view of one 106 of the SPSTBs of FIG. 9. SPSTB 106 includes flexible printed circuit portion 107, a plurality of contact beams 108, a plurality of self-adjusting surface-mount attachment structures 109, and an insulative slide-guide structure 110.

Figure 11:
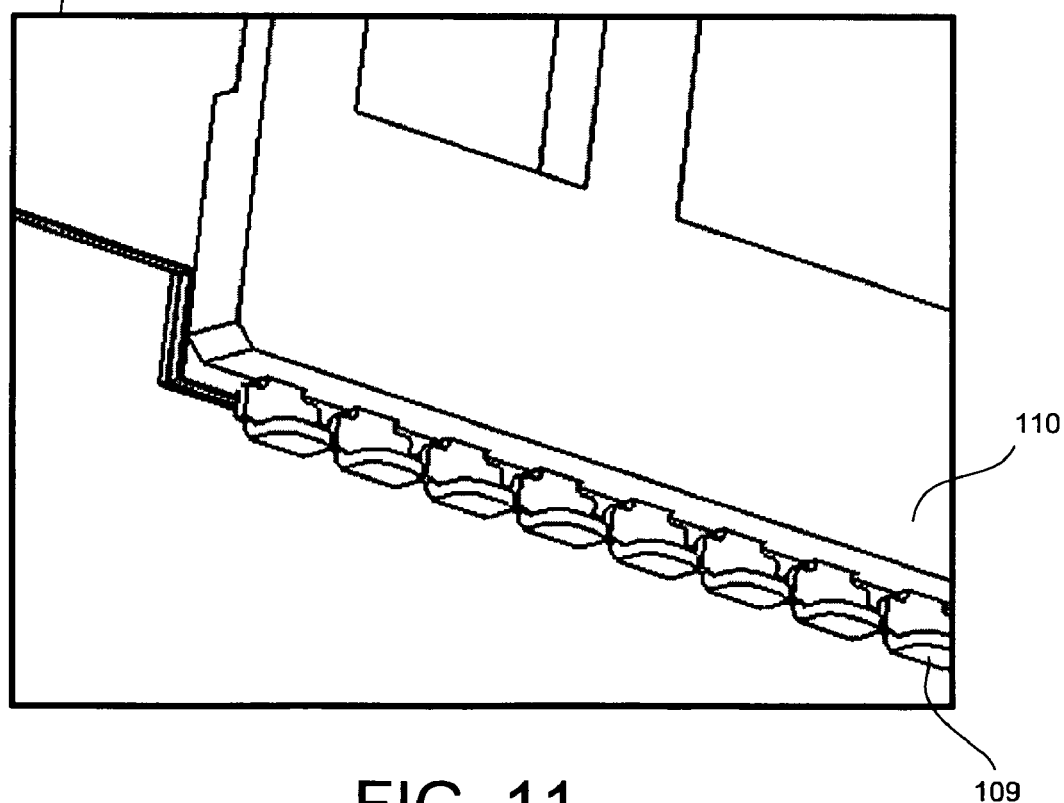

FIG. 11 is an enlarged view of portion 111 of FIG. 10.

Figure 12:
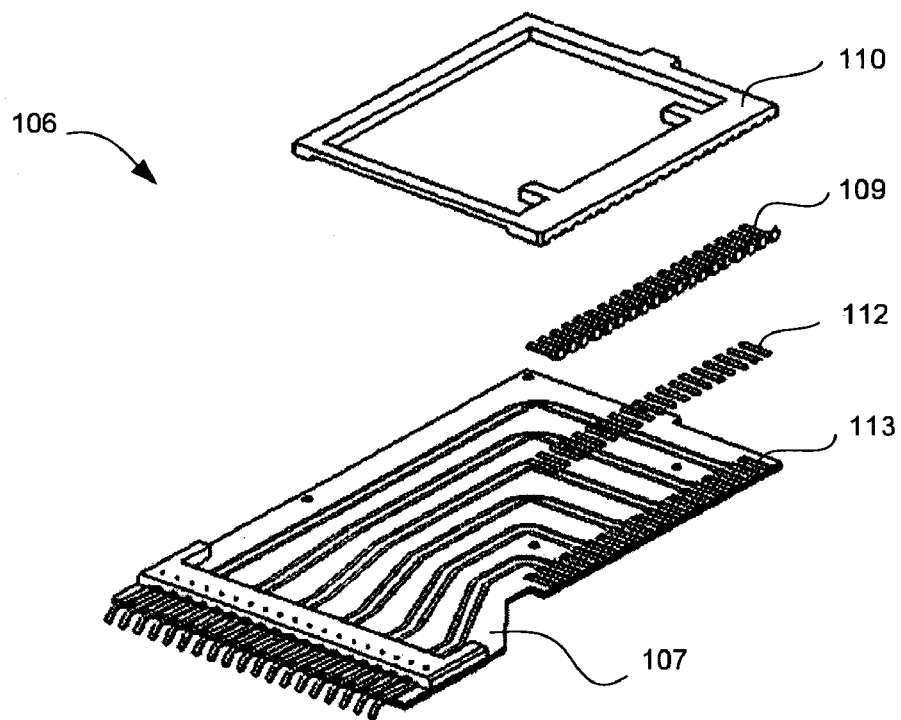

FIG. 12 is an exploded view of SPSTB 106. Amounts of solder 112 are illustrated. This solder 112 attaches the surface-mount attachment structures 109 to the planar sliding surfaces 113 at the ends of signal conductors of the flexible printed circuit portion 107.

Figure 13:
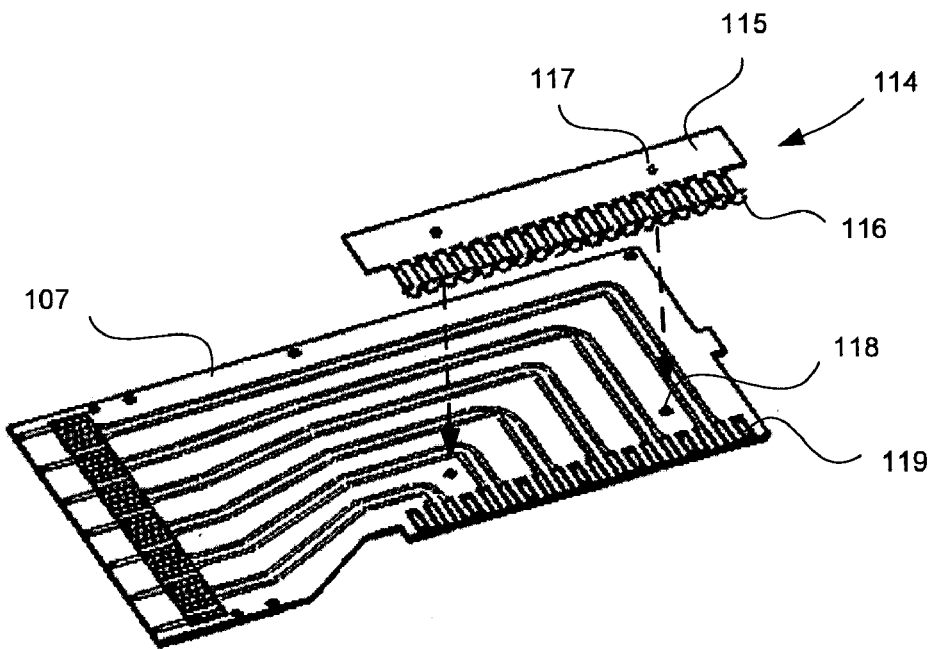

FIG. 13 illustrates a novel method of mating a solder tail frame 114 to flexible printed circuit portion 107 to form an assembly. The frame 114 is stamped out of sheet metal and includes a rail portion 115 and a plurality of self-adjusting surface-mount attachments portions 116. Frame 114 resembles a comb in structure. The solder tail frame 114 includes pilot holes 117. The flexible printed circuit portion 107 includes pilot holes 118. After an amount of solder paste is placed on the planar sliding surfaces 119 of the flexible printed circuit portion 107, the pilot holes 117 and 118 are used along with a pilot pin on an assembly fixture to position the solder tail frame with respect to the flexible printed circuit portion. The resulting assembled is heated such that each of the self-adjusting surface-mount attachment portions is soldered to a corresponding one of the planar sliding surfaces. The rail 115 is then removed from the remainder of the assembly, thereby leaving self-adjusting surface-mount attachment structures attached to the flexible printed circuit portion 107.

FIG. 14 is a cross-sectional view that illustrates a self-adjusting surface-mount attachment structure 120 disposed in a slide-groove 121. Slide-groove 121 is a guide for the self-adjusting surface-mount attachment structure 120. Groove 121 is one of many identical grooves in insulative slide-guide structure 122. The self-adjusting surface-mount attachment structures, the insulative slide-guide structure 122, and the flexible printed circuit portion 123 together form a substantially planar signal transmission body (SPSTB). Reference numeral 124 represents solder that connects the self-adjusting surface-mount attachment structure 120 to the planar sliding surface 125 of flexible printed circuit portion 123. During a novel assembly process, the connector is placed on a printed circuit board and is heated such that solder 124 melts, thereby allowing self-adjusting surface-mount attachment structure 120 to slide in groove 121.

FIG. 15 is a sectional view taken along line A-A of FIG. 14.

FIG. 16 is an exploded view of motherboard connector 102. Connector 102 includes an insulative housing 126 and a plurality of printed circuit portions 127. Each printed circuit portion has self-adjusting surface-mount attachment structures that are attached in the same way set forth above in connection with FIG. 13.

Figure 17:
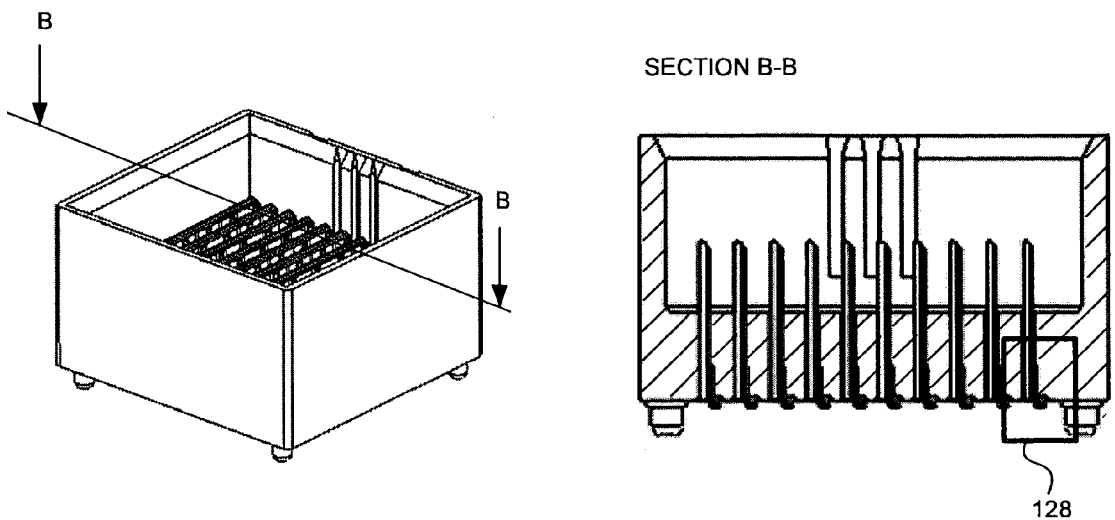

FIG. 17 shows a sectional view of motherboard connector 102 taken along sectional line B-B.

Figure 18:
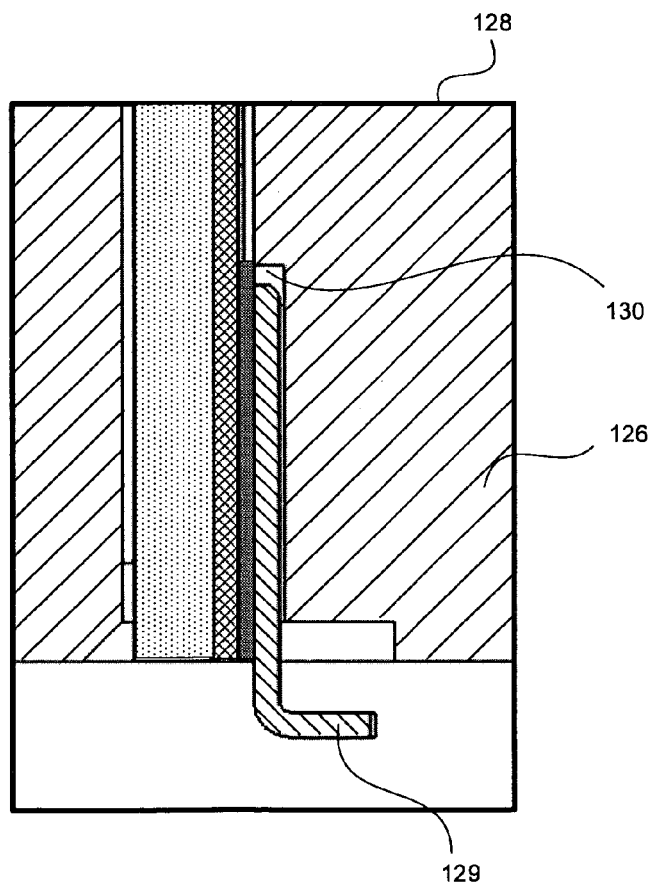

FIG. 18 is an enlarged cross-sectional view of portion 128 of FIG. 17. FIG. 18 illustrates a self-adjusting surface-mount attachment structure on one of the printed circuit portions of FIG. 17. In the example of FIG. 18, the guide in which the self-adjusting surface-mount attachment structure 129 slides is a groove 130 in insulative housing 126. There is no separate insulative slide-guide structure in FIG. 18 as there is in FIG. 14.

FIGS. 19 and 20 illustrate a connector 101 disposed on printed circuit board 131. An amount of solder paste 132 is disposed on printed circuit board 131. Warpage of printed circuit board 131 is exaggerated to show that all the surface-mount attachment structures of connector 101 may not be touching solder paste 132.

FIGS. 21 and 22 illustrate the connector 101 of FIGS. 19 and 20, after heating. The heating causes solder within the connector to melt, and thereby allow the self-adjusting surface-mount attachment structures to slide along their corresponding planar sliding surfaces with the connector. They slide to varying degrees absorb warpage of the printed circuit board 131 as illustrated in FIGS. 21 and 22. Arrow 132A represents relative movement between the connector 101 and printed circuit board 131 as various ones of the self-adjusting surface-mount attachment structures are pushed into their respective slide-grooves.

Figure 23:
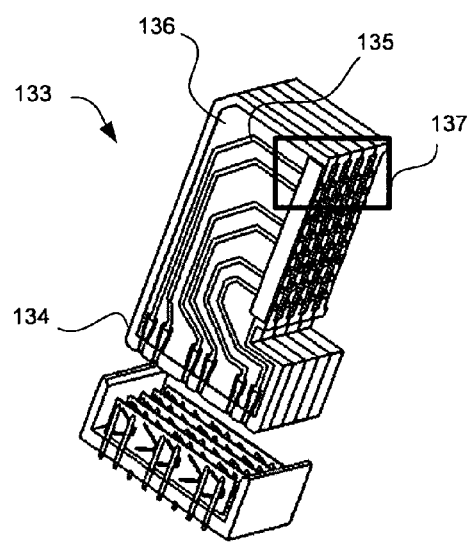

FIG. 23 is a partial perspective exploded view of another type of backplane connector 133 in accordance with another novel aspect. Unlike connector 101 of FIG. 8, connector 133 involves a stack of wafers 134, where each wafer includes a plurality of signal conductors 135 that are stamped from a piece of sheet metal. Each wafer includes, in addition to the plurality of signal conductors 135, an insulative member 136 that retains the signal conductors.

Figure 24:
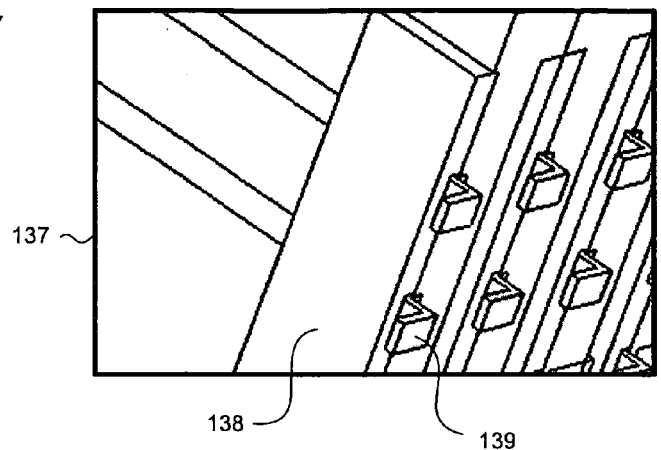

FIG. 24 is an enlarged view of a portion 137 of FIG. 23. Reference numeral 138 is an insulative slide-guide structure that provides guides for self-adjusting surface-mount attachment structures 139.

Figure 25:
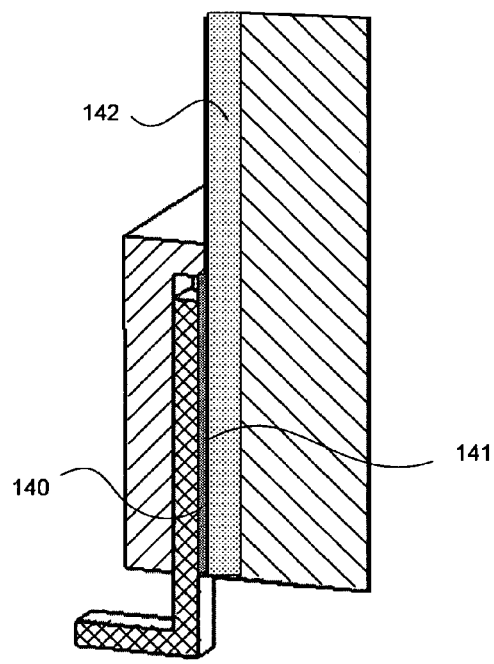

FIG. 25 is a cross-sectional view of one of the self-adjusting surface-mount attachment structures of FIG. 24. When solder 140 melts in the connector-to-PCB attachment process, self-adjusting surface-mount attachment structure can slide along a planar sliding surface 141 of stamped conductor 142. When overall connector/PCB assembly cools, the self-adjusting surface-mount attachment structure is soldered in place to the planar sliding surface 141.

For additional detail on how to make an embodiment of connector assembly 100 (other than the novel self-adjusting surface-mount attachment structure aspect, slide-guides and related methods described above), see U.S. Pat. No. 6,986,682 (the subject matter of U.S. Pat. No. 6,986,682 is incorporated by reference in its entirety).

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. An electrical connector comprising:
 a plurality of substantially planar signal transmission bodies (SPSTB), the SPSTBs being disposed parallel to one another, wherein each SPSTBs comprises a printed circuit structure with a plurality of planar sliding surfaces;
 an insulative housing that retains the plurality of SPSTBs;
 a self-adjusting surface-mount attachment structure that is confined by a guide; and
 a layer of low melting-temperature metal disposed between the self-adjusting surface-mount attachment structure and the planar sliding surface of one of the SPSTBs so that if the layer melts the self-adjusting surface-mount attachment structure can slide in the guide on the planar sliding surface with respect to the SPSTB with molten metal contacting both the self-adjusting attachment structure and the planar sliding surface.

2. The electrical connector of claim 1, wherein the layer is solder, and wherein the layer of solder is adhered to the planar sliding surface prior to said melting.

3. The electrical connector of claim 1, wherein the layer is solder, and wherein the layer of solder is adhered to both the self-adjusting surface-mount attachment structure and the planar sliding surface prior to said melting.

4. An electrical connector comprising:
 a plurality of substantially planar signal transmission bodies (SPSTB), the SPSTBs being disposed parallel to one another, wherein each SPSTBs comprises a printed circuit structure with a plurality of planar sliding surfaces;
 an insulative housing that retains the plurality of SPSTBs;
 a self-adjusting surface-mount attachment structure that is confined by a guide, wherein the guide is a channel in the insulative housing, the channel extending in a direction; and
 a layer of low melting-temperature metal disposed between the self-adjusting adjusting surface-mount attachment structure and the planar sliding surface of one of the SPSTBs so that if the layer melts the self-adjusting surface-mount attachment structure can slide in the guide on the planar sliding surface with respect to the SPSTB in the direction in the channel with molten metal contacting both the self-adjusting attachment structure and the planar sliding surface.

5. The electrical connector of claim 4, wherein the layer is solder, and wherein the layer of solder is adhered to the planar sliding surface prior to said melting.

6. The electrical connector of claim 4, wherein the layer is solder, and wherein the layer of solder is adhered to both the self-adjusting surface-mount attachment structure and the planar sliding surface prior to said melting.

7. An electrical connector comprising:
 a plurality of substantially planar signal transmission bodies (SPSTB), the SPSTBs being disposed parallel to one another, wherein each SPSTBs comprises a printed circuit structure with a plurality of planar sliding surfaces, wherein each of the SPSTBs includes an insulative slide-guide structure, wherein the insulative slide-guide structure forms a plurality of guides for guiding a plurality of self-adjusting surface-mount attachment structures;
 an insulative housing that retains the plurality of SPSTBs;
 a self-adjusting surface-mount attachment structure that is confined by a guide; and
 a layer of low melting-temperature metal disposed between the self-adjusting surface-mount attachment structure and the planar sliding surface of one of the SPSTBs so that if the layer melts the self-adjusting surface-mount attachment structure can slide in the guide on the planar sliding surface with respect to the SPSTB with molten metal contacting both the self-adjusting attachment structure and the planar sliding surface.

8. The electrical connector of claim 7, wherein each of the SPSTBs includes:
 a plurality of stamped metal conductors; and
 an insulative member that retains the plurality of stamped metal conductors.

9. An electrical connector, comprising:
 a plurality of signal transmission conductor/surface-mount attachment structure assemblies, wherein each of the assemblies comprises:
 a printed circuit structure with a signal transmission conductor having a sliding surface;
 a self-adjusting surface-mount attachment structure; and
 a layer of low melting-temperature metal disposed between the self-adjusting surface-mount attachment structure and the sliding surface so that if the layer melts the self-adjusting surface-mount attachment structure can slide on the sliding surface with molten metal contacting both the self-adjusting attachment structure and the sliding surface.

10. The electrical connector of claim 9, wherein the self-adjusting surface-mount attachment structure weighs less than 0.1 gram.

11. The electrical connector of claim 9, wherein each of the assemblies further comprises:
 an insulative slide-guide structure for guiding the self-adjusting surface-mount attachment structure.

12. An electrical connector, comprising:
 a plurality of substantially planar signal transmission body (SPSTB), wherein each of the SPSTBs comprises a plurality of a printed circuit structure with signal transmission conductor/surface-mount attachment structure assemblies, wherein each of the assemblies comprises:
a signal transmission conductor having a sliding surface;
a self-adjusting surface-mount attachment structure; and
a layer of low melting-temperature metal disposed between the self-adjusting surface-mount attachment structure and the sliding surface so that if the layer melts the self-adjusting surface-mount attachment structure can slide on the sliding surface with molten metal contacting both the self-adjusting attachment structure and the sliding surface.

13. The electrical connector of claim 12, wherein each of the SPSTBs further comprises:
an insulative member that retains the signal transmission conductor.

14. The electrical connector of claim 12, wherein each of the assemblies further comprises:
an insulative slide-guide structure for guiding the self-adjusting surface-mount attachment structure.

15. An electrical connector comprising:
an insulative housing;
a plurality of substantially planar signal transmission bodies (SPSTB) contained within the insulative housing, the SPSTBs being disposed parallel to one another, wherein each of the SPSTBs comprises:
a plurality a printed circuit structure with of planar sliding surfaces;
a plurality of self-adjusting surface-mount attachment structures;
an insulative slide-guide structure, wherein the insulative slide-guide structure forms a plurality of guides for guiding the plurality self-adjusting surface-mount attachment structures; and
a plurality of layers of low melting-temperature metal disposed between each one of the plurality of self-adjusting surface-mount attachment structures and a corresponding one of the plurality of planar sliding surfaces so that if the layers melts the self-adjusting surface-mount attachment structures can slide in the guides on the planar sliding surfaces with molten metal contacting both the self-adjusting attachment structures and the planar sliding surfaces.

16. The electrical connector of claim 15, wherein each of the SPSTBs further comprises:
a plurality of stamped metal conductor; and
an insulative member that retains the plurality of stamped metal conductor.

17. The electrical connector of claim 15, wherein each of the STSTBs further comprises:
a plurality of contact beams.

18. The electrical connector of claim 15, wherein each of the guides is a slide-groove.

* * * * *

UNITED STATES PATENT AND TRADEMARK OFFICE
CERTIFICATE OF CORRECTION

PATENT NO. : 7,413,451 B2  Page 1 of 1
APPLICATION NO. : 11/594314
DATED : August 19, 2008
INVENTOR(S) : Myoungsoo Jeon It is certified that error appears in the above-identified patent and that said Letters Patent is hereby corrected as shown below:

Column 4, lines 66-67, the characters "a plurality of a printed circuit structure with signal transmission" should be changed to --a printed circuit structure with a plurality of signal transmission--.

Column 5, lines 27-28, the characters "a plurality a printed circuit structure with of planar sliding surface" should be changed to --a printed circuit structure with a plurality of planar sliding surface--.

The text from column 4, lines 64-67, should now read:

--12. An electrical connector, comprising:
  a plurality of substantially planar signal transmission body
    (SPSTB), wherein each of the SPSTBs comprises a
    printed circuit structure with a plurality of signal transmis- --

The text from column 5, lines 21-27, should now read:

--15. An electrical connector comprising:
  an insulative housing;
  a plurality of substantially planar signal transmission bodies
    (SPSTB) contained within the insulative housing, the
    SPSTBs being disposed parallel to one another, wherein
    each of the SPSTBs comprises:
  a printed circuit structure with a plurality of planar sliding
    surfaces;--

Signed and Sealed this

Twenty-eighth Day of October, 2008

JON W. DUDAS
*Director of the United States Patent and Trademark Office*